United States Patent
Johnson et al.

(10) Patent No.: US 10,817,647 B1
(45) Date of Patent: Oct. 27, 2020

(54) REPORT AUTOMATION SYSTEM

(71) Applicant: Wells Fargo Bank, N.A., San Francisco, CA (US)

(72) Inventors: Jeffrey H. Johnson, Lakewood, CO (US); Debra L. Johnson, Englewood, CO (US); Gretchen W. Owens, Smyrna, GA (US); Nadezhda V. Turner, Lawrenceville, GA (US)

(73) Assignee: Wells Fargo Bank, N.A., San Francisco, CA (US)

( * ) Notice: Subject to any disclaimer, the term of this patent is extended or adjusted under 35 U.S.C. 154(b) by 0 days.

(21) Appl. No.: 15/794,135

(22) Filed: Oct. 26, 2017

(51) Int. Cl.
*G06F 17/21* (2006.01)
*G06F 40/103* (2020.01)
(Continued)

(52) U.S. Cl.
CPC ........ *G06F 40/103* (2020.01); *G06F 16/2423* (2019.01); *G06F 16/258* (2019.01); *G06F 16/335* (2019.01); *G06F 30/00* (2020.01); *G06F 40/186* (2020.01); *G06Q 10/10* (2013.01); *G06T 11/60* (2013.01); *H04L 51/04* (2013.01)

(58) Field of Classification Search
CPC ............. G06F 17/211; G06F 17/30551; G06F 17/30554; H04W 24/10; H04L 43/06
See application file for complete search history.

(56) References Cited

U.S. PATENT DOCUMENTS 5,051,924 A * 9/1991 Bergeron ................ G10L 13/08
704/200
6,236,980 B1 * 5/2001 Reese ..................... G06Q 30/02
705/26.1
(Continued)

FOREIGN PATENT DOCUMENTS

CN 106528502 3/2017
CN 106649241 5/2017

OTHER PUBLICATIONS

Webopedia, "What is email software," copyright 2012, www.webopedia.com, https://web.archive.org/web/20120308210006/https://www.webopedia.com/TERM/E/email_software.html, (Year: 2012).*
(Continued)

*Primary Examiner* — Maikhanh Nguyen
(74) *Attorney, Agent, or Firm* — Alston & Bird LLP

(57) ABSTRACT

An apparatus, computer program product and method are provided for managing automatic generation of reports using computer program queries. Embodiments intelligently determining if a report is needed based on application data, and if so, automatically generating the report. The application data may include data from a calendar application, communication application, social media application, user profile, and/or the like. The application data is analyzed to determine report parameters, including a type of report data, range of the report data, and grouping characteristic of the report data. The report parameters may be further based on a report request history, and/or user profiles, in which a user may indicate generally what data may be desired in a report. In
(Continued)

some examples, no user input is required for a particular report to be generated. Reports that are no longer needed may be automatically prevented from being generated.

19 Claims, 3 Drawing Sheets

(51) Int. Cl.
| | | |
|---|---|---|
| *G06T 11/60* | (2006.01) | |
| *H04L 12/58* | (2006.01) | |
| *G06Q 10/10* | (2012.01) | |
| *G06F 16/25* | (2019.01) | |
| *G06F 16/335* | (2019.01) | |
| *G06F 16/242* | (2019.01) | |
| *G06F 30/00* | (2020.01) | |
| *G06F 40/186* | (2020.01) | |

(56) References Cited

U.S. PATENT DOCUMENTS

| | | | |
|---|---|---|---|
| 8,515,897 B2 | 8/2013 | Gao et al. | |
| 8,838,465 B2 | 9/2014 | Goldberg et al. | |
| 9,009,615 B2 | 4/2015 | Yu et al. | |
| 9,053,440 B2 | 6/2015 | Chmiel et al. | |
| 9,424,333 B1* | 8/2016 | Bisignani | G06F 17/30592 |
| 2006/0218271 A1* | 9/2006 | Kasslin | H04L 43/06 |
| | | | 709/224 |
| 2006/0288033 A1* | 12/2006 | Raz | G06F 17/30516 |
| 2007/0130257 A1* | 6/2007 | Bedi | G06Q 10/107 |
| | | | 709/204 |
| 2007/0143350 A1* | 6/2007 | Burns, III | G06F 17/30592 |
| 2008/0091709 A1* | 4/2008 | Chang | G06Q 10/06 |
| 2009/0163199 A1* | 6/2009 | Kazmi | H04L 1/0026 |
| | | | 455/425 |
| 2010/0218092 A1* | 8/2010 | Xiang | G06Q 10/10 |
| | | | 715/273 |
| 2012/0078976 A1* | 3/2012 | Ehrler | G06Q 10/109 |
| | | | 707/803 |
| 2012/0254949 A1* | 10/2012 | Mikkonen | G06F 21/73 |
| | | | 726/4 |
| 2014/0095990 A1* | 4/2014 | Blanchard | G06F 17/248 |
| | | | 715/255 |
| 2014/0156681 A1* | 6/2014 | Lee | G06F 16/9535 |
| | | | 707/754 |
| 2015/0046842 A1* | 2/2015 | Barr | H04L 65/403 |
| | | | 715/753 |
| 2015/0213406 A1 | 7/2015 | Markham et al. | |
| 2016/0103585 A1 | 4/2016 | Varadharajan et al. | |
| 2019/0096012 A1* | 3/2019 | Sankey | G06Q 40/08 |

OTHER PUBLICATIONS

Michael R. Groh, "Access 2010 Bible," copyright 2010, Wiley Publishing Inc., p. 742 (Year: 2010).*

Merriam-Webster, "Social Media," copyright 2012, merriam-webster. com, https://web.archive.org/web/20121003155802/https://www.merriam-webster.com/dictionary/social%20media, p. 1-2 (Year: 2012).*

Wang et al. "The design of intelligent workflow monitoring with agent technology." Knowledge-Based Systems vol. 18 (2005); pp. 257-266.

* cited by examiner

REPORT AUTOMATION SYSTEM

TECHNOLOGICAL FIELD

Example embodiments of the present invention relate generally to automated reporting, and more particularly, to a system, apparatus, computer program product, and method for managing automatic generation of reports using computer program queries. Embodiments intelligently determining if a report is needed based on application data, and if so, automatically generating the report.

BACKGROUND

The inventors have discovered problems with existing mechanisms relating to report creation and maintenance. Through applied effort, ingenuity, and innovation, the inventors has solved many of these identified problems by developing solutions embodied by the present invention and described in detail below.

BRIEF SUMMARY

With the advancement of modern computing technology, an abundance of data is collected and stored by systems operative in a wide array of environments. In manufacturing, finance, e-commerce, and other industries, users create reports to access desired data in a specified format. As illustrated in FIG. 1, which is an example of a prior art system, a user may utilize user device 102 to configure a report. The user may access a reporting system 104, for example, and provide parameters regarding the desired data. The reporting system 104 may then submit a query to a data source 106, and provide the returned report to the user device 102.

Report templates may be saved by the reporting system for other users to access, and the same reports may be generated and/or sent to the report creator or subscribing users on a routine basis, such as monthly or quarterly, for example. However, several problems result from such reporting systems. Although periodic reporting can reduce the burden of manually requesting reports over and over again, a result of periodic reporting is that many reports are unused or under-utilized, wasting storage space as well as the processing resources expended to run the queries and communicate with the data source(s). Moreover, as time progresses, some reports may not reflect the needs of the report recipient or audience. For instance, some reports may not update as user roles within an organization shift.

Historically, to generate the report a user would need to allocate time in advance of a meeting or other deadline to access a user interface and provide detail regarding the data desired in the report. In more complex cases, report creation may historically have even required a dedicated staff of data analysts and data developers skilled in developing code to retrieve the desired data in a readable format for users.

Example embodiments address these problems by automatically determining when a report is needed, the frequency a report is needed, generating the report parameters and report, and transmitting the report to the user. Example embodiments may therefore automatically determine that a report is needed and generate the report without the user having to access a user interface and specify the desired data, and without the need for users to write code to configure or request the report.

An apparatus is provided for managing automatic generation of reports using computer program queries. The apparatus comprises at least one processor and at least one memory including computer program code, the at least one memory and the computer program code configured to, with the processor, cause the apparatus to access application data associated with (a) a particular user and (b) at least one of a calendar application, communication application, social media application, or user profile. The communication application may include, for example, at least one of an email application, short message service (SMS), voicemail application, chat application, or telephone records application The apparatus is further configured to automatically determine whether a report is needed based on the application data, and in an instance in which the apparatus determines that a report is needed, generate report parameters based on the application data. The report parameters comprise (a) a type of report data, (b) a range of the report data, and (c) a grouping characteristic of the report data. If the report is needed, the apparatus is further configured to generate a computer program code query based on the report parameters, and transmit the computer program code query to a data source. In response to the transmittal of the computer program code query, the apparatus receives a report from the data source, and enables access to the report for the particular user.

The at least one memory and the computer program code are further configured to, with the processor, cause the apparatus to determine formatting information based on the application data, wherein the formatting information defines at least one of a layout, font, or visual graphics of the report, and apply the formatting information to the report.

The application data may identify report audience members in addition to the particular user. The at least one memory and the computer program code are further configured to, with the processor, cause the apparatus to determine audience characteristics based on the report audience members, and generate the report parameters further based upon the audience characteristics. The range of the report data may include at least one of a date range, organizational range, or numerical range. The user profile may include user-provided metadata describing desired data.

In some examples, the apparatus is further configured to compile a plurality of historical reports with the report to provide a trending report to the particular user.

In an instance in which the apparatus determines that a report is not needed, the apparatus prevents a report from being generated that would otherwise have been generated.

A method for managing automatic generation of reports using computer program queries is also provided. The method includes accessing application data associated with (a) a particular user and (b) at least one of a calendar application, communication application, social media application, or user profile, and automatically determining, with a processor, whether a report is needed based on the application data.

In an instance in which the processor determines that the report is needed, the method further includes generating report parameters based on the application data. The report parameters includes (a) a type of report data, (b) a range of the report data, and (c) a grouping characteristic of the report data. If the report is needed, the method further includes generating a computer program code query based on the report parameters, transmitting the computer program code query to a data source, and in response to the transmittal of the computer program code query, receiving a report from the data source. The method further includes enabling access to the report for the particular user.

A computer program product for managing automatic generation of reports using computer program queries is also provided. The computer program product comprises at least one non-transitory computer-readable medium having computer-readable program instructions stored therein, the computer-readable program instructions comprising instructions, which when performed by an apparatus, are configured to cause the apparatus to access application data associated with (a) a particular user and (b) at least one of a calendar application, communication application, social media application, or user profile, and automatically determine whether a report is needed based on the application data.

In an instance in which the apparatus determines that a report is needed, the computer-readable program instructions further include instructions to cause the apparatus to generate report parameters based on the application data. The report parameters comprise (a) a type of report data, (b) a range of the report data, and (c) a grouping characteristic of the report data. If a report is needed, the apparatus generates a computer program code query based on the report parameters, and transmits the computer program code query to a data source. In response to the transmittal of the computer program code query, the apparatus receives a report from the data source, and enables access to the report for the particular user.

An apparatus with means for managing automatic generation of reports using computer program queries is also provided. The apparatus includes means for accessing application data associated with (a) a particular user and (b) at least one of a calendar application, communication application, social media application, or user profile, and automatically determining, with a processor, whether a report is needed based on the application data.

In an instance in which the processor determines that the report is needed, the apparatus further includes means for generating report parameters based on the application data, the report parameters comprising (a) a type of report data, (b) a range of the report data, and (c) a grouping characteristic of the report data. If the report is needed, the apparatus further includes means for generating a computer program code query based on the report parameters, transmitting the computer program code query to a data source, and in response to the transmittal of the computer program code query, receiving a report from the data source. The apparatus further includes means for enabling access to the report for the particular user.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings, which are not necessarily drawn to scale.

DETAILED DESCRIPTION

Figure 1:
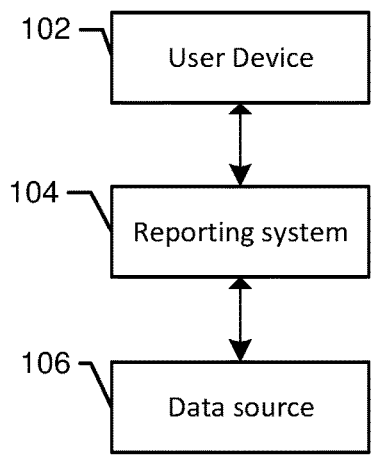
FIG. 1 is a diagram illustrating various devices that may interact according to some prior art systems.

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Overview

As noted above, methods, apparatuses, and systems are described herein that provide for automatic report creation. Example embodiments access application data associated with a particular user. The application data may be accessed from an application operative on a user device, such as a calendar application, communication application, social media application or user profile, for example. The application data may therefore indicate meeting invitees to upcoming meetings on the particular user's calendar, meeting and email subjects or other details, social events or preferences, user or employee roles within an organization, and/or the like. Application data, such as a user's role within an organization (which may be indicated in a user profile), may further indicate whether a report is needed.

Example systems described herein may thus process the application data to determine whether a report is needed. For example, if a particular user will be conducting an upcoming meeting, example embodiments may predict that the user needs a report before the meeting. However, if a meeting is cancelled, or a regularly scheduled meeting no longer occurs, the report may not be needed.

Report parameters and/or report formats may be generated according to the application data, as well. Report parameters and/or report formats may be based on report request history, and/or a user profile. For example, if a user requests a specific report on a routine basis, example embodiments may proactively generate the report and provide it to the user, or in some examples, to other users having similar roles or characteristics as the report requester. As another example, a user may provide a data user configuration, profile, and/or the like, to indicate what types of data and/or reports are desired. Certain example embodiments may alert a user when a report becomes available. In some examples, if it is determined that a periodically delivery report is no needed or no longer needed, example embodiments may stop the report from being generated and/or distributed.

Further detail regarding example embodiments is provided below.

Definitions

As used herein, the terms "data," "content," "information," and similar terms may be used interchangeably to refer to data capable of being transmitted, received, and/or stored in accordance with embodiments of the present invention. Thus, use of any such terms should not be taken to limit the spirit or scope of embodiments of the present invention. Further, where a computing device is described herein to receive data from another computing device, it will be appreciated that the data may be received directly from the another computing device or may be received indirectly via one or more intermediary computing devices, such as, for example, one or more servers, relays, routers, network access points, base stations, hosts, and/or the like, sometimes referred to herein as a "network." Similarly, where a computing device is described herein as sending data to another computing device, it will be appreciated that the data may be sent directly to the another computing device or may be sent indirectly via one or more intermediary computing devices, such as, for example, one or more servers, relays, routers, network access points, base stations, hosts, and/or the like.

As used herein, the term "application data" refers to any data detected, accessed, or otherwise received that is indicative of, report parameters, report formats, and/or whether a report is needed. The application data may originate from any application operative on a computing device, such as but not limited to a user device, or a database configured for storing application data. For example, the application data may be accessed from a calendar application, communication application, social media application, user profile application, and/or any other type of application. The application data may relate to potential or identified report audience members (that may differ from the particular user to which access to the report may be provided). In some examples, the application data may originate from a sensor or other source, such as but not limited to an accelerometer, global positioning system (GPS), motion sensor, and/or the like, which provide indicia of a user's current location and/or possible future location(s). The application data may relate specifically to an individual user or group of users.

As used herein, the term "report audience member" may refer to any individual or group of users to whom a report is addressed or who may ultimately be expected to view or receive the report. The report audience member may include individuals or groups beyond the particular user for which the report is initially provided. For example, a particular user may have a meeting invitation on a calendar, for which the particular user may be presenting to a group. The report may be initially generated and provided to the particular user, but a larger audience may later view the report in the meeting. In this regard, the report may be tailored for other audience members in addition to the particular user. Report audience members may be determined from application data, such as by identifying an individual or group of individuals listed as a sender or recipient of an email or a calendar invitation. The report audience members may include anyone identified based on application data as potentially viewing or receiving the report.

As used herein, the term "report parameters" refers to any data parameters that may be used in a query to generate a report. As it relates to delivery timing, report parameters may indicate the day and/or time of report delivery and may indicate a repeated interval on which the report should be generated. The report parameters may further include any data to be used as query parameters, such as the type of data to be included in the report, or a range of the report data (e.g., numerical ranges, temporal ranges, data ranges, organizational ranges, and/or any other quantifiable or numerical range). In this regard, an organizational range may comprise a group of individuals, such as a subdivision or department within an organization. A report parameter indicating a quantifiable or numerical range may identify accounts having balances above or below a specified threshold, or within a specified range. The query parameters may further include a grouping characteristic of the report data, such as those expressing sums, averages, or other calculations to be performed on the data retrieved. Accordingly, in some examples, the query parameters may include more complex combinations of data, such as clients having total loan origination amounts of 1 million or more within the first quarter of the year 20xx, where the total loan original amount is summed from a plurality of individual data records. The query parameters may be used for generation of a given report.

According to example embodiments described herein, the report parameters may be generated based on the application data, report request history, user profile, and/or the like. The above examples of report parameters are not intended to be limiting, and the report parameters may include any data, information, or requirements utilized in a query to generate a report, and any information indicating when the query should be executed to generate the report.

As used herein, the term "query" refers to machine-readable computer program code that can be transmitted to a database such that resultant data is returned. In this regard, the query may comprise any number of report parameters, but may further include computer programming language specific commands or instructions configured to enable communication with a database. For example, the query may be in Structured Query Language (SQL) and may comprise the report parameters (such as, e.g., the query parameters described above).

As used herein, the term "formatting information" refers to any data or information describing how the data in a report is arranged or presented within the report, and/or a file type of the report. The report format may therefore include or define, a layout, font, visual graphics, and/or the like to be incorporated into the report. The report format may be based at least partially on the application data, historical reports, and/or the like.

Having set forth a series of definitions called-upon throughout this application, an example system architecture is described below for implementing example embodiments of the present invention.

System Architecture

Methods, apparatuses, and computer program products of the present invention may be performed and/or embodied by any of a variety of devices. For example, the apparatus and computer program product of an example embodiment may be embodied by a networked device, such as a server or other network entity, configured to communicate with one or more devices, such as one or more user devices. Example embodiments of the user devices include any of a variety of mobile terminals, such as a portable digital assistant (PDA), mobile telephone, smartphone, laptop computer, tablet computer, or any combination of the aforementioned devices.

Figure 2:
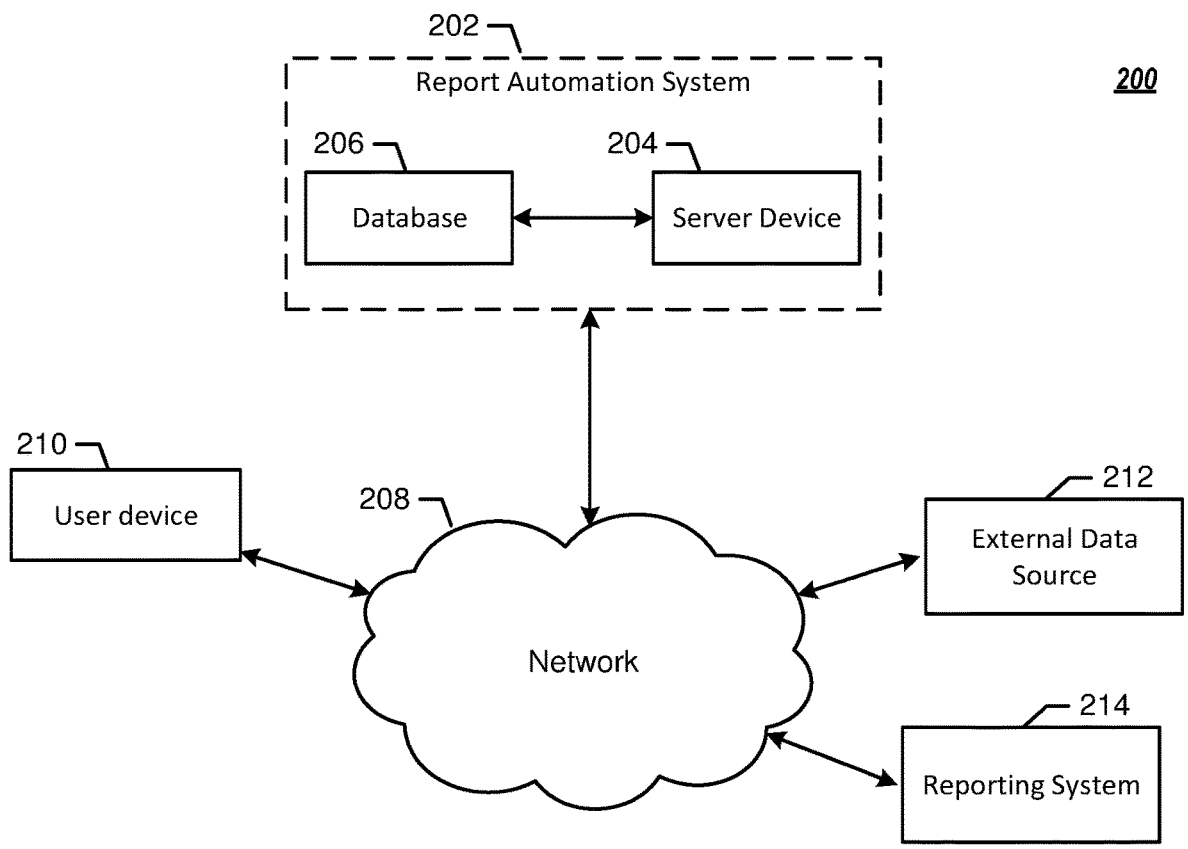
FIG. 2 is a system diagram illustrating various devices that may interact according to some example embodiments described herein.

In this regard, FIG. 2 discloses an example computing system 200 in which embodiments of the present invention may operate. As illustrated, a report automation system 202 may be connected to a user device(s) 210, external data source(s) 212, and/or reporting system(s) 214. The report automation system 202 may comprise a server device 204, and database 206.

The report automation system 202 may be embodied as a computer or computers such as apparatus 300 described below. The report automation system 202 may receive application data from various sources, including but not necessarily limited to the user device 210 or external data sources 212. The report automation system 202 may receive this application data via a data retrieval application that is configured to retrieve application data from the user devices 210 or external data sources 212. The data retrieval application may operate in the background such that the user experience is not interrupted and may relay the collected application data to the report automation system 202 either periodically or in near-real-time. In some embodiments, this data retrieval application may be hosted by the report automation system 202 or another intermediary server and may remotely interrogate applications and data stores of the user device(s) 210 or external data source(s) 212. In other embodiments, a copy of the data retrieval application may be loaded onto each respective user device 210 or external data source 212, and may integrate with various other local applications to gather the application data. Moreover, the data retrieval application may operate independently from the other functionality of the report automation system 202 such that the data retrieval application functions the same in the viewpoint of the end-user regardless of any integration of the data retrieval application with the report automation system 202. The report automation system 202 may process the application data, generate report parameters and/or queries accordingly, and provide the report parameters and/or queries to the external data source 212 and/or reporting system 214. The external data source 212 and/or reporting system 214 may then obtain the report and enable access to the report by the user (either by transmitting the report to the user or providing a link to a copy of the report stored remotely from the user).

The database 206 may be embodied as a data storage device such as a Network Attached Storage (NAS) device or devices, or as a separate database server or servers. The database 206 includes information accessed and stored by the report automation system 202 to facilitate the operations of the report automation system 202. For example, the database 206 may store user account credentials for users of user devices 210, and/or authentication information for external data sources 212, reporting system 214, and/or the like. Database 206 may store identifying information pertaining to user devices 210, external data sources 212, and/or reporting system 214. For example, a device identifier of a particular user device 210 registered with the report automation system 202 may be stored in the database 206 such that example embodiments are configured to associate application data received from the particular user device 210 in connection with the device identifier, thereby facilitating the automatic determination of whether a report is needed for that particular user device 210, and to subsequently generate the report and make it available to the particular user device 210.

The user device 210, external data source 212, and/or reporting system 214 may be embodied by any computing device such as apparatus 300 described below. Information received by the report automation system 202 from other devices may be provided in various forms and via various methods.

In embodiments where a user device 210 is a mobile device, such as a smart phone or tablet, the mobile device may execute an "app" to interact with the report automation system 202. For example, an app may be provided that executes on mobile device operating systems such as Apple Inc.'s iOS®, Google Inc.'s Android®, or Microsoft Inc.'s Windows®. These platforms typically provide frameworks that allow apps to communicate with one another and with particular hardware and software components of mobile devices. For example, the mobile operating systems named above each provide frameworks for interacting with location services circuitry, wired and wireless network interfaces, user contacts, and other applications in a manner that allows for improved interactions between apps while also preserving the privacy and security of individual users. In some embodiments, a mobile operating system may also provide for improved communication interfaces for interacting with external devices (e.g., home automation systems, indoor navigation systems, and the like) that can provide application data relevant to reporting needs (e.g., by indicating times of day when a user may be physically available in particular locations such as a home office and ostensibly available to review a report). Communication with hardware and software modules executing outside of the app is typically provided via application programming interfaces (APIs) provided by the mobile device operating system. An app operative on the user device 210 may generate and/or store application data that is provided to report automation system 202 according to example embodiments.

The external data source 212 may be any computing devices known in the art, such as a database, data repository, data warehouse, and/or the like. The external data source 212 may store data to be queried, optionally compiled and/or re-formatted, and inserted into a report, according to the direction of the report automation system 202 and/or reporting system 214 as described herein. In some examples, the report automation system 202 may be communicatively connected to the external data source 212, and in some examples, the reporting system 214 may serve as an interface between the report automation system 202 and external data source 212.

The reporting system 214 may be any computing devices known in the art, such as a platform, software system, database and/or the like for storing report templates or parameters. For example, the report automation system 202 may generate report parameters and/or queries, and provide the report parameters and/or queries to the reporting system 214. In some examples, the reporting system 214 may generate a query from the provided report parameters, and in some examples, the query may be provided to the reporting system 214 from the report automation system 202 or another source. The reporting system 214 may store the report parameters and/or queries, and may utilize the report parameters and/or queries to execute the queries by querying the external data source 212. For example, the report automation system 202 may provide particular report parameters and/or a query along with an indication of when and how often the report should be run (e.g., frequency), and to which users the report should be provided, for example. The reporting system 214 may further store such configurations locally, such as when a particular user should be added or removed from a report subscription, as directed by the report automation system 202.

According to some embodiments, the external data source 212 may comprise the reporting system 214. In this regard, the report automation system 202 may not distinguish between various components to which it provides report parameters and in turn receives reports or information enabling access to reports. The external data source 212 and/or reporting system 214 may therefore collectively provide the requested reports to the report automation system 202. However, it will be understood that reporting system 214 provides a distinct set of functional operations, and thus is referred to herein as a separate entity for maintaining and utilizing the queries that enable access to the reports.

It will be appreciated that FIG. 2 is provided merely as an example of one system environment, and other example embodiments may utilize different arrangements of components, such as embodiments where the external data source 212 comprises the reporting system 214 as described above, or, in some embodiments, where report automation system 202 itself may also comprise the external data source 212 and/or reporting system 214.

Example Implementing Apparatus

Figure 3:
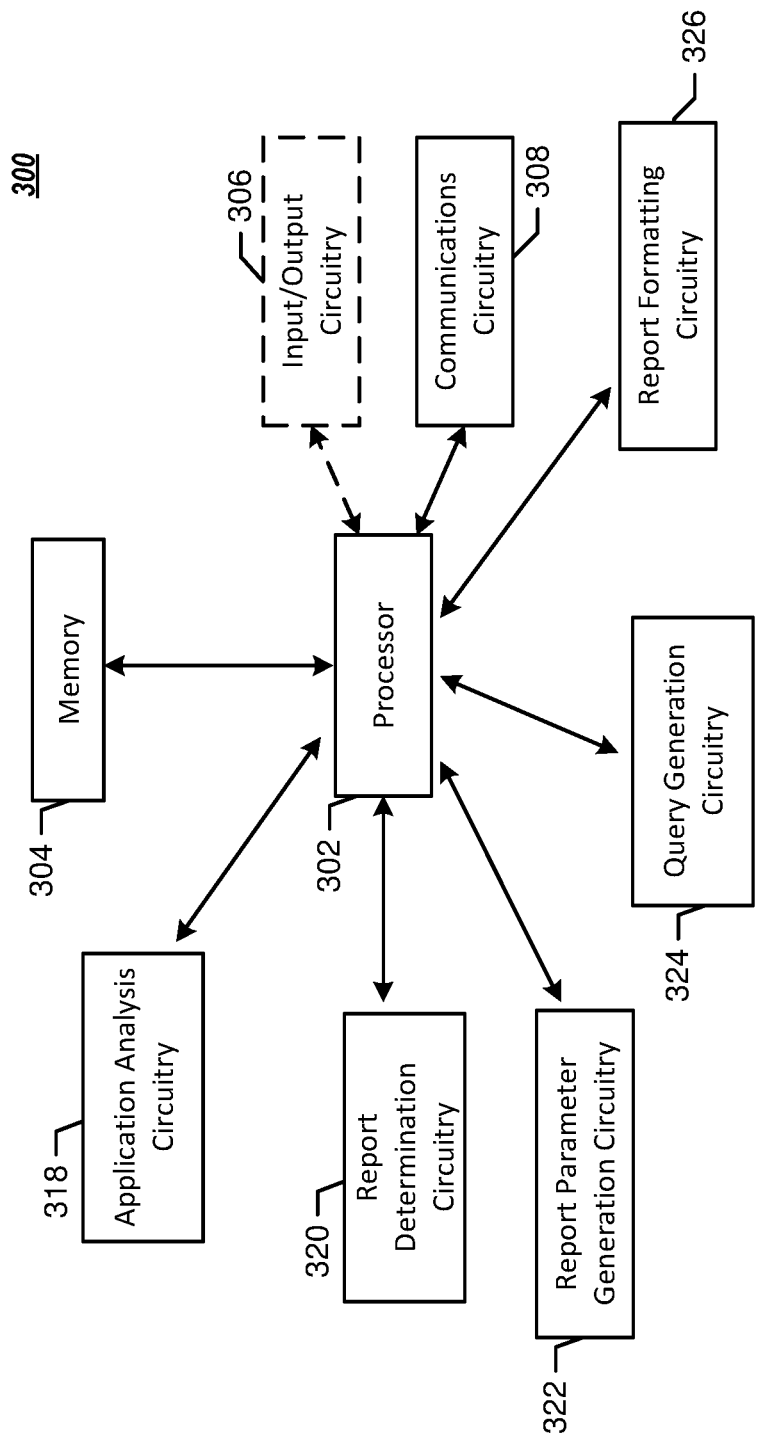
FIG. 3 is a schematic block diagram of example circuitry that may perform operations overcoming challenges faced by historical reporting systems, in accordance with some example embodiments described herein.

The report automation system 202 may be embodied by one or more computing systems, such as apparatus 300 shown in FIG. 3. As illustrated in FIG. 3, the apparatus 300 may include a processor 302, a memory 304, input/output circuitry 306, communications circuitry 308, application analysis circuitry 318, report determination circuitry 320, report parameter generation circuitry 322, query generation circuitry 324, and/or report formatting circuitry 326. The apparatus 300 may be configured to execute the operations described below with respect to FIG. 4. Although the components of FIG. 3 may in some cases be described using functional limitations, it should be understood that all particular implementations necessarily include the use of particular hardware. It should also be understood that certain of these components of FIG. 3 may include similar or common hardware. For example, two sets of circuitry may both leverage use of the same processor, network interface, storage medium, or the like to perform their associated functions, such that duplicate hardware is not required for each set of circuitry. The use of the term "circuitry" as used herein with respect to components of the apparatus therefore includes particular hardware configured to perform the functions associated with respective circuitry described herein.

Of course, while the term "circuitry" should be understood broadly to include hardware, in some embodiments, circuitry may also include software for configuring the hardware. For example, in some embodiments, "circuitry" may include processing circuitry, storage media, network interfaces, input/output devices, and the like. In some embodiments, other elements of the apparatus 300 may provide or supplement the functionality of particular circuitry. For example, the processor 302 may provide processing functionality, the memory 304 may provide storage functionality, the communications circuitry 308 may provide network interface functionality, and the like.

In some embodiments, the processor 302 (and/or co-processor or any other processing circuitry assisting or otherwise associated with the processor) may be in communication with the memory 304 via a bus for passing information among components of the apparatus. The memory 304 may be non-transitory and may include, for example, one or more volatile and/or non-volatile memories. In other words, for example, the memory may be an electronic storage device (e.g., a computer readable storage medium). The memory 304 may be configured to store information, data, content, applications, instructions, or the like, for enabling the apparatus to carry out various functions in accordance with example embodiments of the present invention.

The processor 302 may be embodied in a number of different ways and may, for example, include one or more processing devices configured to perform independently. Additionally or alternatively, the processor may include one or more processors configured in tandem via a bus to enable independent execution of instructions, pipelining, and/or multithreading. The use of the term "processing circuitry" may be understood to include a single core processor, a multi-core processor, multiple processors internal to the apparatus, and/or remote or "cloud" processors.

In an example embodiment, the processor 302 may be configured to execute instructions stored in the memory 304 or otherwise accessible to the processor. Alternatively or additionally, the processor may be configured to execute hard-coded functionality. As such, whether configured by hardware methods, or by a combination of hardware with software, the processor may represent an entity (e.g., physically embodied in circuitry) capable of performing operations according to an embodiment of the present invention while configured accordingly. Alternatively, as another example, when the processor is embodied as an executor of software instructions, the instructions may specifically configure the processor to perform the algorithms and/or operations described herein when the instructions are executed.

In some embodiments, the apparatus 300 may include input/output circuitry 306 that may, in turn, be in communication with processor 302 to provide output to the user and, in some embodiments, to receive an indication of a user input. The input/output circuitry 306 may comprise a user interface and may include a display that may include a web user interface, a mobile application, a client device, or the like. In some embodiments, the input/output circuitry 306 may also include a keyboard, a mouse, a joystick, a touch screen, touch areas, soft keys, a microphone, a speaker, or other input/output mechanisms. The processor and/or user interface circuitry comprising the processor may be configured to control one or more functions of one or more user interface elements through computer program instructions (e.g., software and/or firmware) stored on a memory accessible to the processor (e.g., memory 304, and/or the like).

The communications circuitry 308 may be any means such as a device or circuitry embodied in either hardware or a combination of hardware and software that is configured to receive and/or transmit data from/to a network and/or any other device, circuitry, or module in communication with the apparatus 300. In this regard, the communications circuitry 308 may include, for example, a network interface for enabling communications with a wired or wireless communication network. For example, the communications circuitry 308 may include one or more network interface cards, antennae, buses, switches, routers, modems, and supporting hardware and/or software, or any other device suitable for enabling communications via a network. Additionally or alternatively, the communication circuitry 308 may include circuitry for interacting with the antenna(s) to cause transmission of signals via the antenna(s) or to handle receipt of signals received via the antenna(s). These signals may be transmitted by the apparatus 300 using any of a number of wireless personal area network (PAN) technologies, such as Bluetooth® v1.0 through v3.0, Bluetooth Low Energy (BLE), infrared wireless (e.g., IrDA), ultra-wideband (UWB), induction wireless transmission, or the like. In addition, it should be understood that these signals may be transmitted using Wi-Fi, Near Field Communications (NFC), Worldwide Interoperability for Microwave Access (WiMAX) or other proximity-based communications protocols.

Application analysis circuitry 318, report determination circuitry 320, report parameter generation circuitry 322, query generation circuitry 324, and/or report formatting circuitry 326 each include hardware components designed to perform respective operations as described below. These hardware components may, for instance, utilize communications circuitry 308, processing circuitry, such as the processor 302, to perform the above operations, and may utilize memory 304 to store data and computer programming code. It should also be appreciated that, in some embodiments, the application analysis circuitry 318, report determination circuitry 320, report parameter generation circuitry 322, query generation circuitry 324, and/or report formatting circuitry 326 may each include a separate processor, specially configured field programmable gate array (FPGA), or application specific interface circuit (ASIC) to perform its corresponding functions.

In general, the application analysis circuitry 318 may be configured to access or receive application data pertaining to a user or group of users, from applications operative on a user device 210, or other device. The report determination circuitry 320 may be configured to enable apparatus 300 to determine whether a particular user may need a report, or whether an existing report subscription may be cancelled. Report parameter generation circuitry 322 may be configured to enable apparatus 300 to generate or select report parameters in an instance a report is needed. Query generation circuitry 324 may be configured to generate computer readable programming code queries to query a database based on given report parameters. And finally, report formatting circuitry 326 may be configured to enable apparatus 300 to generate or determine formatting information to apply to reports.

As will be appreciated, any such computer program instructions and/or other type of code may be loaded onto a computer, processor or other programmable apparatus's circuitry to produce a machine, such that the computer, processor other programmable circuitry that execute the code on the machine create the means for implementing various functions, including those described herein.

As described above and as will be appreciated based on this disclosure, embodiments of the present invention may be configured as systems, methods, mobile devices, backend network devices, and the like. Accordingly, embodiments may comprise various means including entirely of hardware or any combination including both software and hardware. Furthermore, embodiments may take the form of a computer program product on at least one non-transitory computer-readable storage medium having computer-readable program instructions (e.g., computer software) embodied in the storage medium. Any suitable computer-readable storage medium may be utilized including non-transitory hard disks, CD-ROMs, flash memory, optical storage devices, or magnetic storage devices.

The user device 210, external data source 212, and/or reporting system 214 may be embodied by one or more computing systems that also may include a processor, a memory, an input/output circuitry, and a communications circuitry. As it relates to operations described in the present invention, the functioning of these components may be similar to that of the similarly named components described above with respect to FIG. 3, and for the sake of brevity, additional description of the mechanics of these components is omitted. Nevertheless, these device elements, operating together, provide the respective apparatuses with the functionality necessary to facilitate the processing, storage, or communication of data as described herein.

Having described specific components of example devices involved in the present invention, an example procedure for intelligently determining if a report is needed based on application data, and generating the report if so, is described below in connection with FIG. 4.

Example Operations of Example Embodiments

Figure 4:
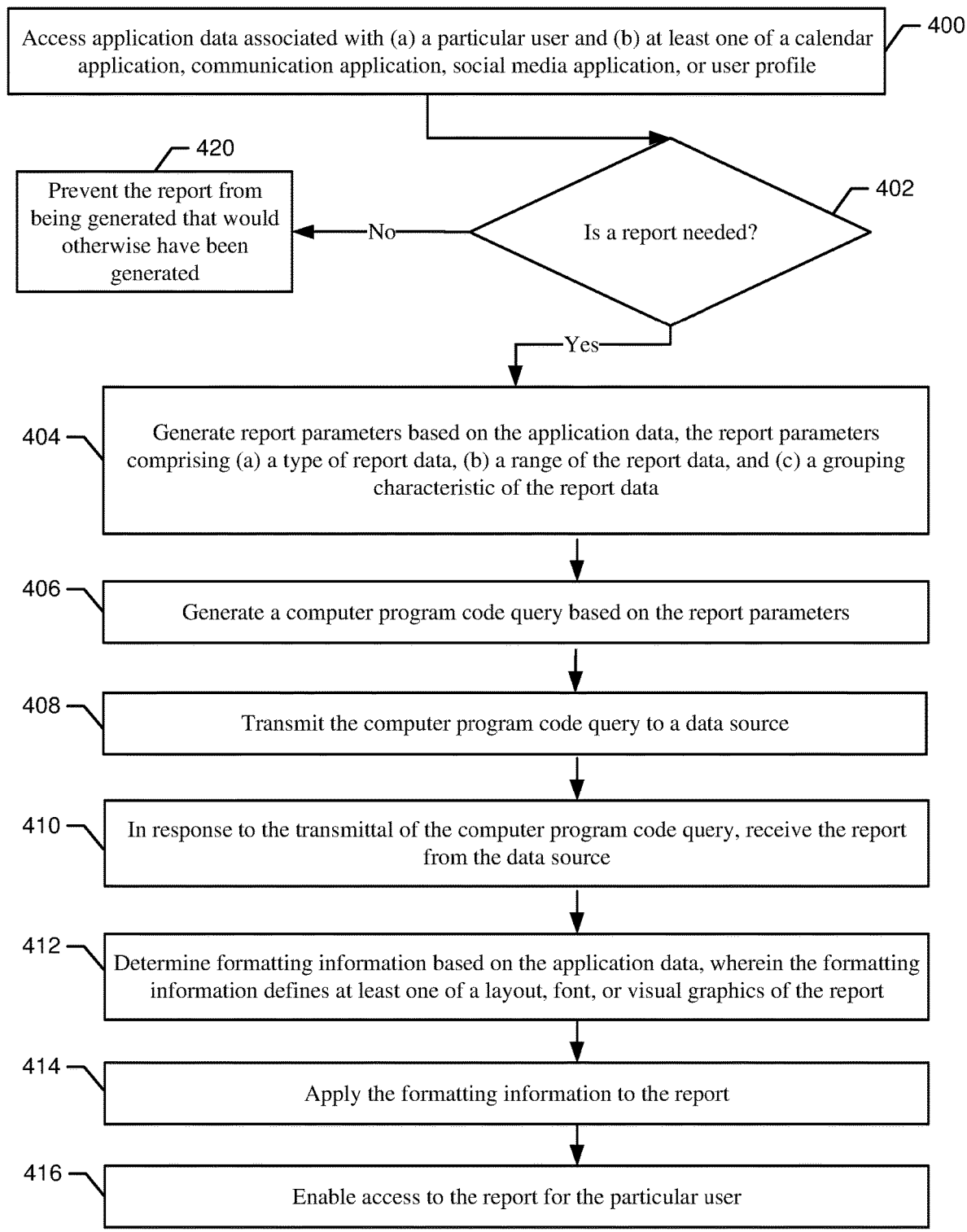
FIG. 4 is a flowchart illustrating example operations performed in accordance with some example embodiments described herein.

FIG. 4 is a flowchart of operations according to some example embodiments. As shown by operation 400, report automation system 202 may comprise means, such as application analysis circuitry 318, processor 302, memory 304, communications circuitry 308 and/or the like, for accessing application data associated with (a) a particular user and (b) at least one of a calendar application, communication application, social media application, or user profile.

In some embodiments, a particular user or group of users may be registered with a service provided by report automation system 202 such that application data associated with the particular user is accessed and processed according to example embodiments described below. In some examples, report automation system 202 may interact with a data retrieval application to monitor application data on a continual basis, or in some embodiments, on a periodic basis, such as nightly, weekly, and/or the like. The report automation system 202 may then process the application data as described herein. In some embodiments, the report automation system 202 may itself execute the data retrieval application, although in other embodiments, the report automation system 202 may interact with a separate data retrieval application as described previously. For the sake of brevity, the monitoring actions described below are described as being performed by report automation system 202. However, it should be understood that in some embodiments contemplated herein, these actions are performed by a distinct data retrieval application not executed by the report automation system 202.

In one example, report automation system 202 may monitor application data on a user device 210, such as by checking calendar applications for upcoming meetings. Example embodiments of the report automation system 202 may determine invitees of a meeting, and assess their roles and/or the particular user's roles within an organization, such as by accessing user profiles which may comprise employee roles or titles. The application data may therefore comprise information identifying report audience members that are not necessarily the particular user, or that are identified in addition to the particular user. In this regard, the particular user may be considered the user having associated application data analyzed by the report automation system 202, or the user for whom the report is generated. However, the particular user may subsequently forward or present the report to a wider audience which may include the report audience members.

As another example, a meeting subject or detailed description of a meeting from a calendar application may be accessed in application data operative on a user device. In some examples, application data may also be obtained from a communication application, such as but not limited to, an email application, short message service (SMS), voicemail application, chat application or telephone records application. Any such information in a calendar application, or a communication obtained from the aforementioned communication applications may be used as application data in determining report parameters, as described below. The application data may therefore comprise natural language that may be processed by report automation system 202 to determine the report parameters.

In some embodiments, accessing the application data may require pre-processing of natural language data, such as from messages, calendar entries, and/or social media applications, and/or otherwise extracting the application data from such applications prior to evaluation of the application data.

In some embodiments, a user may configure settings in an app or other interface to indicate which applications the report automation system 202 and/or application analysis circuitry 318 should access and/or monitor. In some examples, the user may provide authentication information to various applications so that the application data can be accessed by report automation system 202 and/or application analysis circuitry 318.

The above examples of application data are provided merely as examples and are not intended to be limiting. It will be appreciated that the application data may be accessed by report automation system 202 in a variety of ways. Report automation system 202 may monitor application data by accessing the application data on a routine time interval, such as nightly. As yet another example, applications operative on the user device 210, or a remote third party server, such as a social media platform, may push data to the report automation system 202 and/or analysis circuitry 318. However collected, the application data may be stored by the report automation system 202, such as on database 206 and/or memory 304, for example.

As shown in operation 402, report automation system 202 may comprise means, such as report determination circuitry 320, processor 302, memory 304, communications circuitry 308 and/or the like, for automatically determining whether a report is needed based on the application data. In some example embodiments, report automation system 202 may automatically determine that a report may be needed such that user input requesting the report is not required. As referred to herein, determining whether a report is needed may comprise determining whether a report is desired, or likely to be desired or used by a user. If a report is needed, then the procedure advances to operation 404, which is described below. If a report is not needed, then the procedure instead advances to operation 420, which is also described below.

Example embodiments may determine that a report is needed or desired (or not needed or desired) based on any number of rules implemented within report determination circuitry 320, memory 304, and/or the like. For example, if a threshold number of rules are satisfied, the report determination circuitry 320 may determine that a report is needed. As another example, report determination circuitry 320 may calculate scores for various reports based on rules, and determine that a report is needed based on a total score for the report that is generated as a sum or other combination of numerical outputs of rules for the report. A score satisfying a predefined threshold value may then result in report determination circuitry 320 determining that the report is needed (or not needed).

In some examples, the report determination circuitry 320 may base the determinations on a user configuration that only generally describes when reports are desired, but that does not necessarily indicate specify instances in which reports are desired. For example, a user may configure, with a user interface, that any time a meeting appears on the user's calendar with the user's manager, Mr. Jones, a report should be generated identifying a current status of a particular set of key deliverables, and that the report should be provided to the user the day before the meeting. In another example embodiment, a user may configure report determination circuitry 320 and/or report automation system 202 to determine that a report is needed if an email is received from a particular individual or email address, and the body and/or subject of the email includes particular predefined key words selected or provided by the user. For example, report determination circuitry 320 and/or report automation system 202 may calculate points or a score for each key word identified in a communication, and evaluate the total score to determine whether a report is likely needed.

The report determination circuitry 320 may therefore be configured to process the user configurations relative to the monitored application data, on a routine basis to determine whether or not a report should be generated.

As mentioned above, in some embodiments, no user input may be needed by the particular user for the report determination circuitry 320 to determine that a report is needed. For example, the report determination circuitry 320 may determine that a report is needed by comparing a user profile of a first user to user profiles of other users to identify those users who have similarities in their profiles to the first user, such as having the same job title or user role within an organization. If a user having user profile similarities has configured his or her user profile to identify certain desired reports (as described in further detail below), and/or has a history of requesting particular reports, the report automation system 202 may predict that the first user will have similar preferences, and may thus deliver reports of the nature desired by users having user profile similarities, despite not receiving an explicit request for such reports from the first user.

As another example, report determination circuitry 320 may analyze past requests for reports by a particular user and intelligently identify patterns in the desired reports. The report determination circuitry 320 may then preemptively determine a report is desired without the user having to request the report.

If a report is needed, then the procedure advances to operation 404, in which the report automation system 202 comprises means, such as report parameter generation circuitry 322, processor 302, memory 304, communications circuitry 308 and/or the like, for generating report parameters comprising (a) a type of report data, (b) a range of the report data, and (c) a grouping characteristic of the report data.

The report parameters may include any data parameters that may be used in a query to generate a report. The type of data indicated by the report parameters may be associated with a table and field (e.g., column) in a database or external data source 212, for example. In some examples, a plurality of tables and/or columns may be identified as report parameters.

The report parameters may further include range requirements. The range requirements may include a maximum and/or minimum amount, date range, or the like relating to each selected data type or any data that is associated with the selected data type. The range requirements may further include an organizational range (e.g., a branch of a company hierarchy, etc.). In this regard, the range requirements may also comprise a database column in a particular table, and/or plurality of columns.

The report parameters may further include a grouping characteristic of the report data. For example, a quantifiable data type may be summed or averaged for a particular grouping of data. The grouping may be further defined by a column in a database.

The report parameters may be based at least on the application data, report request history, and/or user profile. The application data may be identified based on preconfigured associations stored in memory between data values that may occur in application data and data in a database. For example, an employee identifier of a particular user or report audience member may be associated with a value in a database representing the individual's role within an organization, or the individual's department within an organization. In this regard, a report parameters may be identified in a database table as associated with the application data detected and/or analyzed by example embodiments.

In some embodiments, the report automation system 202 may determine audience characteristics based on the report audience members, and generate the report parameters further based upon the audience characteristics. The audience characteristics may comprise any information or data pertaining to other users known to the report automation system 202, for example. As an example, a user profile of an audience member, who may not be the particular user for whom the report is generated, may be utilized in determining the report parameters. User profiles are described in further detail below. As another example, the information comprising the audience characteristics of a particular audience member may be generated from automatic evaluation of email correspondence between the particular user and the particular audience member, or from evaluating which meetings stored by the calendar application of the particular user were meetings to which the particular audience member was also invited.

In some embodiments, report request history of a particular user or group of users may inform the identification of report parameters. Past requests including requests to the reporting system 214 and/or external data source 212, for example, may be considered in identifying report parameters. For example, if users in the past have repeatedly requested a particular type of data, the report parameters may take this into account to ensure that type of data is identified in a future report (but possibly in combination with a different data set or parameter, such as a more recent data range). The report request history for the particular user, or as another example, the report request history of a report audience member identified in the application data, may be considered in determining report parameters.

As mentioned above, in some embodiments, report automation system 202 and/or report parameter generation circuitry 322 may base the generated report parameters on a user profile. A user profile may include some default data that may be configured by an organization, such as a user role or job title, and/or the like. A particular user and/or report audience members may also configure their user profile to indicate data that is of interest. The configuration of a user profile may be performed with a user interface, for example. According to some embodiments, a user profile may be configured on behalf of a particular user, user group, report audience member, and/or the like.

According to some embodiments, the user profile may comprise user-provided metadata describing desired data. The user profile and/or metadata may therefore comprise indications of particular table and column pairs from a database or any other data that may be interpreted as report parameters and/or query parameters. Additionally or alternatively, the particular user or report audience members may choose predefined report templates or report segment templates in their user profile. For example, any particular user or report audience member that is a manager may have an associated report template (in which case every manager receives same type of default report), etc. A report, template, or template segment may be selected from a library or repository. The configuration of a user profile may be performed independently from the operations of FIG. 4.

In one specific example, the above factors may be utilized in generating an example set of report parameters that includes a data type of 'payments received,' a range of 'the preceding month to the query execution date,' accounts in the Special Assets organization of a company, and a grouping characteristic of 'sum for team leader.' The report parameters may further indicate that the report should be run on the $5^{th}$ of every month and should be provided to a user have a job title of 'supervisor of team A.'

The above report parameters are provided merely as an example and it will be appreciated the report parameters may include any data or requirements that may be presented as a query, such as an SQL query.

As shown in operation 406, the report automation system 202 comprises means, such as query generation circuitry 324, processor 302, memory 304, communications circuitry 308 and/or the like, for generating a computer program code query based on the report parameters. In this regard, report automation system 202 may be configured to generate computer program code compatible with a database system to retrieve the desired data for the report. The report parameters may be applied to preconfigured query templates, for example, to generate queries that, when executed, retrieve the corresponding data from the database. The query may be in SQL or any other database query language.

As shown by operation 408, the report automation system 202 comprises means, such as processor 302, memory 304, communications circuitry 308 and/or the like, for transmitting the computer program code query to a data source. In some embodiments, transmitting the query to a data source may comprise transmitting the query to an external data source 212 and/or reporting system 214. For example, the query, once submitted to a reporting system 214, may be stored for subsequent use. The reporting system 214 (and/or report automation system 202, in embodiments in which the reporting system 214 comprises a component of the report automation system 202) may be configured to transmit the query to the external data source 212 to retrieve the requested data.

In some examples, report automation system 202 may further direct the reporting system 214 to transmit the query on a predetermined schedule or periodic basis, as may be directed, in some example embodiments, by the application data. For example, report automation system 202 may determine based on a routine monthly calendar invitation that a particular report should be run on a monthly basis. Such information defining when or how often the report should be run may be determined by example embodiments and transmitted to the reporting system 214.

As shown by operation 410, the report automation system 202 comprises means, such as processor 302, memory 304, communications circuitry 308 and/or the like, for receiving the report from the data source in response to the transmittal of the computer program code query. In this regard, the report may be received from the external data source 212 and/or the reporting system 214. The reporting system 214 may be configured to execute a query received by the report automation system 202 and return the results to the report automation system 202. The returned results may be considered the report, or in some embodiments, may be considered raw data that is formatted to create a report by the report automation system 202 as described below.

As shown by operation 412, the report automation system 202 comprises means, such as processor 302, memory 304, communications circuitry 308 and/or the like, for determining formatting information based on the application data, wherein the formatting information defines at least one of a layout, font, or visual graphics of the report. For example, if the application data indicates a particular user and/or report audience member is in an analytical role (such as data analyst and/or the like), the report may be returned in a spreadsheet or comma separated value (CSV) format. As another example, if it is determined the report audience members include a large audience, an audience outside of the organization of the particular user (who may, for instance, be a presenter at a conference), and/or the like, the formatting information may include a visually pleasing format with graphics recognizing the organization, and may be presented in a presentation format or file type, such as a portable format document (PDF), for example. In some examples, the formatting information may be based on templates that define any of a layout, font, and/or visual graphics of the report. The formatting information may further identify whether a report includes charts, the format of any such charts (e.g., pie chart, line graph, etc.) and/or whether data is provided in rows or columns, table size, spacing, and/or the like.

As shown by operation 414, the report automation system 202 comprises means, such as processor 302, memory 304, communications circuitry 308 and/or the like, for applying the formatting information to the report. In some examples, the external data source 212 and/or reporting system 214 may return unformatted data or raw data. For example, the data may be returned in a CSV file. The report automation system 202 may apply the formatting information described above to the received data or report, such that a formatted version of the report is generated. In some examples, the report may not be formatted and the report or data as returned from the reporting system 214 and/or external data source 212 may be provided to the particular user as described below. In such embodiments, operation 414 may be skipped based on a determination, in operation 412, that no formatting is called for by the application data.

Continuing to operation 416, the report automation system 202 comprises means, such as processor 302, memory 304, communications circuitry 308 and/or the like, for enabling access to the report for the particular user. Report automation system 202 may initiate an email to the particular user, or provide an alert via a communication application that the report is available in a cloud-based system, by which the particular user may access the report. An alert may be provided via a mobile device, television, smart watch, vehicle display, or any other user device.

As another example, the report automation system 202 may associate the report with the application data. For example, the report may be added to a calendar invitation for a meeting, or attached in a draft reply email to a previously received email that was analyzed and resulted in the report automation system 202 determining a report was needed. The report may not necessarily be made available to all report audience members as identified in the application data, but rather may be provided only to the particular user whose associated application data is accessed (e.g., the account owner of application data accessed). In some example embodiments, the set of recipients to receive the report can be predefined by the particular user based on a desired default level of sharing. In some examples, security may be in place such that only authorized users are provided access to reports in which they are authorized to view.

Operations 404, 406, 408, 410, 412, 414, and 416 are example operations that may be performed by report automation system 202 when it is determined a report may be needed. However, in some examples, report automation system 202 may determine that a report is not needed. If the report comprises an ad hoc report that would otherwise not be sent, then no further action may be necessary. However, for reports that will be delivered by default (e.g., periodically delivered reports, or reports to which the particular user has subscribed), the additional step of operation 420 is described below to account for instances in which the report should not be delivered even though a recurring delivery has at one point in the past been authorized.

As shown in operation 420, the report automation system 202 may comprise means, such as processor 302, memory 304, communications circuitry 308 and/or the like, for preventing a report from being generated that would otherwise have been generated. In this regard, the report generation system 202 may track prior generated report parameters, queries, and/or the like, in association with the application data that resulted in their creation. If the application data changes such that the report automation system 202 determines the report is no longer needed, the report automation system 202 may prevent the report from being generated going forward by transmitting a request to reporting system 214 and/or external data source 212. The associated query and/or report may therefore be canceled, deleted and/or the like. In some example embodiments, similar queries and/or reports may be consolidated, leading to reduced memory usage and processing resources utilized to run the queries and/or reports.

For example, if reporting system 214 is maintaining a query and/or report previously generated according to the report automation system 202, the report automation system 202 may subsequently request the reporting system 214 to stop running the report. This may occur when a recurring monthly meeting is removed from a particular user's calendar, for example. The report automation system 202 may track a previously generated query by receiving a unique identifier of the query from the reporting system 214, and storing in memory 204 the unique identifier in association with the application data that resulted in the creation of the query. When the report automation system 202 determines that the report is no longer needed, the report automation system 202 can pass the unique identifier back to the report automation system 202 with the instructions to stop the query from being executed in the future.

The report automation system 202 and/or reporting system 214 may make many modifications to the above operations. For example, report automation system 202 may comprise means, such as such as processor 302, memory 304, communications circuitry 308 and/or the like, for compiling a plurality of historical reports to use as the basis for a trending report for the particular user. In this regard, in an instance in which the recurring reports for various time periods are provided for a particular user, the report automation system 202 may track the recurrence (e.g., with the unique identifier provided by the reporting system 214, for example), and compile data from a plurality of the historical reports to identify trends.

In some embodiments, report parameters generated by the report automation system 202 may be associated with a user role or job title, instead of or in addition to a particular user. In this regard, if a new employee is hired with a same job title as the particular user, or an organizational shifts occurs resulting in changed job roles, the user who has transitioned to the role of the particular user may receive the report, and the user who is no longer associated with the job role will no longer receive the report.

Many benefits are provided by the example embodiments provided above. Due to the intelligent monitoring of application data and prevention of query execution for reports that are no longer needed, processing resources, including processing power, and memory otherwise expended to store the unneeded report may be conserved.

Moreover, accessing application data enables the report automation system 202 to generate reports and provide the reports to users without the users having to access a reporting system, and/or the like to specifically request or configure the reports. The report automation system 202 instead predicts if a report is needed, and further predicts, by the generation of report parameters based on the application data, what data should be included in the report. Example embodiments therefore reduce or eliminate the need for extensive data programming skills and/or software that configures queries based on user input or selection of query parameters, while producing reports that are more relevant and/or timely for users.

FIG. 4 thus illustrates a flowchart describing the operation of apparatuses, methods, and computer program products according to example embodiments contemplated herein. It will be understood that each block of the flowchart, and combinations of blocks in the flowchart, may be implemented by various means, such as hardware, firmware, processor, circuitry, and/or other devices associated with execution of software including one or more computer program instructions. For example, one or more of the procedures described above may be embodied by computer program instructions. In this regard, the computer program instructions which embody the procedures described above may be stored by a memory of an apparatus 300 and executed by a processor 302 of the apparatus 300. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture, the execution of which implements the functions specified in the flowchart blocks. The computer program instructions may also be loaded onto a computer or other programmable apparatus to cause a series of operations to be performed on the computer or other programmable apparatus to produce a computer-implemented process such that the instructions executed on the computer or other programmable apparatus provide operations for implementing the functions specified in the flowchart blocks.

The flowchart blocks support combinations of means for performing the specified functions and combinations of operations for performing the specified functions. It will be understood that one or more blocks of the flowcharts, and combinations of blocks in the flowcharts, can be implemented by special purpose hardware-based computer systems which perform the specified functions, or combinations of special purpose hardware and computer instructions.

Use Case

Having described example embodiments in general terms, the following example embodiments are provided to further illustrate some use cases of some example embodiments.

According to an example embodiment, a particular user named Bob has a meeting on his calendar. The meeting is with his manager. Bob's calendar application is registered with the report automation system 202 such that the report automation system accesses the calendar application two weeks before the meeting and processes the meeting as application data. The report automation system 202 accesses Bob's user profile, which indicates any time he has a meeting with his boss, he would like a report generated including account balances for his team the day prior to the meeting. Bob is busy and will not have time to configure a report to be run at the end of the business day the day before the meeting.

The report automation system 202 generates the report parameters including the desired data and day and time the report is needed. The report automation system 202 transmits the request including the report query to the reporting system 214 so that the reporting system 214 will execute the query at the desired time the evening before the meeting. The report is made accessible to Bob the morning of his meeting, with the up-to-date account balances as desired.

Lisa is in the same role as Bob, but has not configured a user profile, nor has she registered with the report automation system 202. However, Lisa's employer has enabled automatic registration with the report automation system 202 and has set a default user profile for Lisa based on her job title. The report automation system 202 identifies that Lisa is in the same role as Bob, and monitors Lisa's calendar application data for meetings with her manager. The report automation system 202 determines that Lisa will need the same type of report generated for Bob. The report automation system 202 generates report parameters that are similar to Bob's but cover account balances for Lisa's team instead of Bob's. The report automation system 202 determines that Lisa accesses the report and continues generating reports for Lisa's based on Bob's usage configuration.

Months later, Bob retires and an employee, Jennifer, brand new to the organization takes over his position. Jennifer knows nothing about her new role. However, the report automation system 202 determines she is in the role Bob had previously, and sends her the same report prior to her first meeting with her new boss.

CONCLUSION

Many modifications and other embodiments of the present disclosure set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for managing automatic generation of reports from a report data source using computer program queries, the apparatus comprising at least one processor and at least one memory including computer program code, the at least one memory and the computer program code configured to, with the processor, cause the apparatus to:
access application data (a) indicative of a meeting between a particular user and at least one report audience member and (b) provided from an external data source, wherein the external data source is external from the report data source, and comprises at least one of a calendar application, electronic mail application, electronic message application, or social media application;
input the application data provided from the external data source comprising the at least one of the calendar application, the electronic mail application, the electronic message application, or the social media application as externally sourced parameters to a plurality of rules configured to determine whether a report is needed;
determine at least one of (a) a number of the plurality rules satisfied, or (b) a score output by processing the plurality rules with the externally sourced parameters as inputs;
in response to the plurality of rules being processed with the externally sourced parameters, automatically determine that the report is needed, wherein the automatic determination is based on at least one of (a) satisfaction of a threshold number of rules, or (b) satisfaction of a threshold score;
in response to determining that the report is needed, generate externally sourced report parameters based on the at least one report audience member, the externally sourced report parameters comprising (a) a type of report data, (b) a range of the report data, and (c) a grouping characteristic of the report data;
further in response to determining that the report is needed: (a) generate a computer program code query based on the externally sourced report parameters, and (b) transmit the computer program code query to the report data source;
in response to the transmittal of the computer program code query, receive a report from the report data source; and
enable access to the report for the particular user.

2. The apparatus according to claim 1, wherein the at least one memory and the computer program code are further configured to, with the processor, cause the apparatus to:
determine formatting information based on the application data, wherein the formatting information defines at least one of a layout, font, or visual graphics of the report; and
apply the formatting information to the report.

3. The apparatus according to claim 1, wherein the application data from the external data source identifies report audience members in addition to the particular user, and wherein the at least one memory and the computer program code are further configured to, with the processor, cause the apparatus to:
determine audience characteristics based on the report audience members; and generate the externally sourced report parameters further based upon the audience characteristics.

4. The apparatus according to claim 1, wherein the range of the report data comprises at least one of a date range, organizational range, or numerical range.

5. The apparatus according to claim 1, wherein the at least one memory and the computer program code are further configured to, with the processor, cause the apparatus to:
compile a plurality of historical reports with the report to provide a trending report to the particular user.

6. The apparatus according to claim 1, wherein the application data on which the automatic determination that the report is needed is based, and on which the externally sourced report parameters are based originate from at least one of, a short message service (SMS), a voicemail application, a chat application or a telephone records application.

7. The apparatus according to claim 1, wherein the at least one memory and the computer program code are further configured to, with the processor, further cause the apparatus to:
receive different application data, and in an instance in which the apparatus determines that a report is not needed based on the different application data, prevent a report from being generated that would otherwise have been generated.

8. A method for managing automatic generation of reports from a report data source using computer program queries, the method comprising:
accessing application data (a) indicative of a meeting between a particular user and at least one report audience member user and (b) provided from an external data source, wherein the external data source is external from the report data source, and comprises at least one of a calendar application, electronic mail or electronic message application, or social media application;
inputting the application data provided from the external data source comprising the at least one of the calendar application, the electronic mail or message application, or the social media application as externally sourced parameters to a plurality of rules configured to determine whether a report is needed;
determining at least one of (a) a number of the plurality rules satisfied, or (b) a score output by processing the plurality rules with the externally sourced parameters as inputs;
in response to the plurality of rules being processed with the externally sourced parameters, automatically determining, with a processor, that the report is needed, wherein the automatic determination is based on at least one of (a) satisfaction of a threshold number of rules, or (b) satisfaction of a threshold score;
in response to determining that the report is needed, generating externally sourced report parameters based on the at least one report audience member, the externally sourced report parameters comprising (a) a type of report data, (b) a range of the report data, and (c) a grouping characteristic of the report data;
further in response to determining that the report is needed, (a) generating a computer program code query based on the report parameters, and (b) transmitting the computer program code query to the report data source;
in response to the transmittal of the computer program code query, receiving a report from the report data source; and
enabling access to the report for the particular user.

9. The apparatus according to claim 1, wherein the determination of whether the report is needed is performed by a report automation system, and wherein the application data on which the automatic determination that the report is needed is based originated from a data retrieval application operating independently from the report automation system.

10. The apparatus of claim 1, wherein the automatic determination that the report is needed is made without a user requesting the report.

11. The apparatus of claim 1, wherein the apparatus determines the report is needed further based on identification in the application data of an electronic mail or an electronic message from a particular pre-defined sender, wherein at least one of the externally sourced parameters comprises an identity of the pre-defined sender.

12. The apparatus of claim 1, wherein the apparatus determines the report is needed further based on identification of a predefined key word in at least one of a subject or a body of an electronic mail or an electronic message obtained from the external data source that is external from the report data source.

13. The apparatus of claim 1, wherein the apparatus determines the report is needed further based on the application data comprising an indication of the meeting with a predefined meeting participant.

14. A method for managing automatic generation of reports from a report data source using computer program queries, the method comprising:
    accessing application data (a) indicative of a meeting between a particular and at least one report audience member user and (b) provided from an external data source, wherein the external data source is external from the report data source, and comprises at least one of a calendar application, electronic mail or electronic message application, or social media application;
    inputting the application data provided from the external data source comprising the at least one of the calendar application, the electronic mail or message application, or the social media application as externally sourced parameters to a plurality of rules configured to determine whether a report is needed;
    determining at least one of (a) a number of the plurality rules satisfied, or (b) a score output by processing the plurality rules with the externally sourced parameters as inputs;
    in response to the plurality of rules being processed with the externally sourced parameters, automatically determining, with a processor, that the report is needed, wherein the automatic determination is based on at least one of (a) satisfaction of a threshold number of rules, or (b) satisfaction of a threshold score; and
    in response to determining that the report is needed, generating externally sourced report parameters based on the at least one report audience member, the externally sourced report parameters comprising (a) a type of report data, (b) a range of the report data, and (c) a grouping characteristic of the report data; and
    further in response to determining that the report is needed, (a) generating a computer program code query based on the report parameters, and (b) transmitting the computer program code query to the report data source;
    in response to the transmittal of the computer program code query, receiving a report from the report data source; and
    enabling access to the report for the particular user.

15. The method according to claim 14, wherein the application data identifies report audience members in addition to the particular user, and wherein the method further comprises:
    determining audience characteristics based on the report audience members; and
    generating the externally sourced report parameters further based upon the audience characteristics.

16. The method according to claim 14, wherein the application data identifies report audience members in addition to the particular user, and the method further comprises:
    in an instance in which the processor determines that a report is not needed, preventing a report from being generated that would otherwise have been generated.

17. A computer program product for managing automatic generation of reports from a report data source using computer program queries, the computer program product comprising at least one non-transitory computer-readable medium having computer-readable program instructions stored therein, the computer-readable program instructions comprising instructions, which when performed by an apparatus, are configured to cause the apparatus to:
    access application data (a) indicative of a meeting between a particular user and at least one report audience member and (b) provided from an external data source, wherein the external data source is external from the report data source, and comprises at least one of a calendar application, electronic mail application, electronic message application, or social media application;
    input the application data provided from the external data source comprising the at least one of the calendar application, the electronic mail application, the electronic message application, or the social media application as externally sourced parameters to a plurality of rules configured to determine whether a report is needed,
    determine at least one of (a) a number of the plurality rules satisfied, or (b) a score output by processing the plurality rules with the externally sourced parameters as inputs;
    in response to the plurality of rules being processed with the externally sourced parameters, automatically determine that the report is needed, wherein the automatic determination based on at least one of (a) satisfaction of a threshold number of rules, or (b) satisfaction of a threshold score;
    in response to determining that the report is needed, generate externally sourced report parameters based on the at least one report audience member, the externally sourced report parameters comprising (a) a type of report data, (b) a range of the report data, and (c) a grouping characteristic of the report data;
    further in response to determining that the report is needed: (a) generate a computer program code query based on the externally sourced report parameters, and (b) transmit the computer program code query to a report data source;
    in response to the transmittal of the computer program code query, receive a report from the report data source; and
    enable access to the report for the particular user.

18. The computer program product according to claim 17, wherein the application data identifies report audience members in addition to the particular user, wherein the computer-readable program instructions further comprise instructions to cause the apparatus to: determine audience characteristics based on the report audience members; and
    generate the externally sourced report parameters further based upon the audience characteristics.

19. The computer program product according to claim 17, wherein the application data on which the automatic determination that the report is needed is based, and on which the externally sourced report parameters are based originate from at least one of, a short message service (SMS), a voicemail application, a chat application or a telephone records application.

* * * * *